Figure 1:
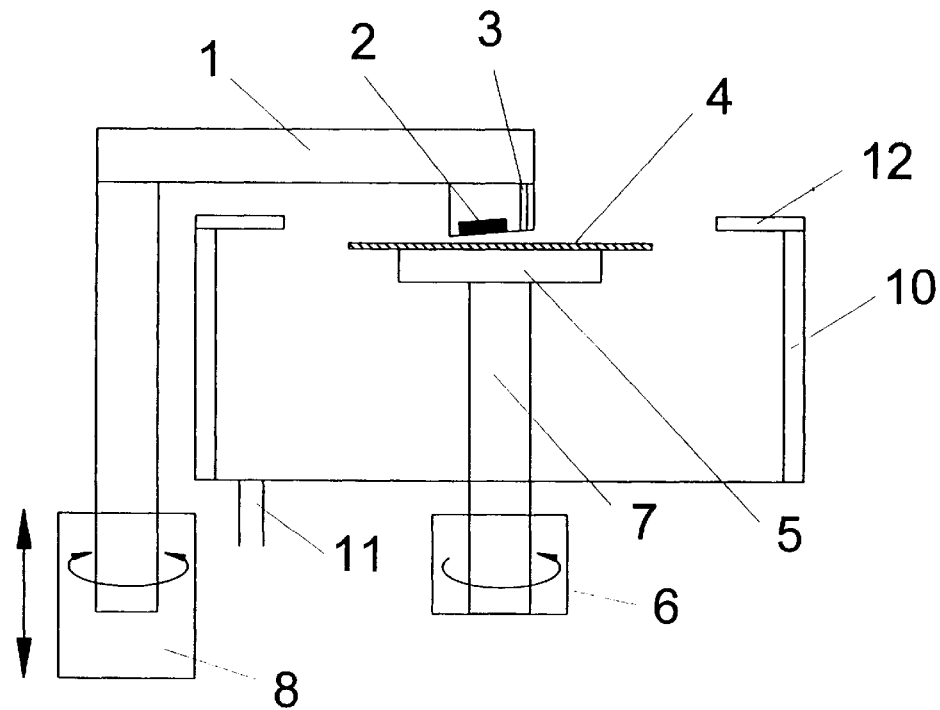

United States Patent
Grutzediek et al.

[11] Patent Number: 6,021,785
[45] Date of Patent: Feb. 8, 2000

[54] PROCEDURE AND DEVICE FOR CLEANING DISK-SHAPED OBJECTS IN PARTICULAR WAFERS BY SONIFICATION WITH WATER AS RINSING MEDIUM

[76] Inventors: Hartmut Grutzediek, An der Klosterheck 16; Joachim Scheerer, Am Fort Weisenau 38, both of D-55130 Mainz, Germany

[21] Appl. No.: 08/899,665

[22] Filed: Jul. 24, 1997

[30] Foreign Application Priority Data

Jul. 24, 1996 [DE] Germany ............... 196 29 705

[51] Int. Cl.⁷ .................. B08B 6/00; B08B 3/00
[52] U.S. Cl. ................ 134/1.3; 134/153; 134/157; 134/902
[58] Field of Search ............. 134/153, 157, 134/902, 1.3

[56] References Cited

U.S. PATENT DOCUMENTS

| | | | |
|---|---|---|---|
| 4,564,280 | 1/1986 | Fukuda | 134/902 |
| 5,032,217 | 7/1991 | Tanaka | 134/902 |
| 5,368,054 | 11/1994 | Koretsky et al. | 134/153 |
| 5,375,291 | 12/1994 | Tateyama et al. | 134/902 |
| 5,562,772 | 10/1996 | Neoh | 134/902 |

*Primary Examiner*—Randy Gulakowski
*Assistant Examiner*—Yolanda E. Wilkins
*Attorney, Agent, or Firm*—Helfgott & Karas, P.C.

[57] ABSTRACT

Procedure and device for cleaning disk-shaped objects, in particular wafers, with sonification and water as rinsing medium and coupling liquid between the ultrasonic transmitter and the surface which is to be cleaned, whereby the wafer is preferentially held by vacuum suction on a rotating plate and the radiating surface of an ultrasonic transmitter is approached to the surface which is to be cleaned to within a distance in the millimeter range and a flowing film of ultra-pure water is produced between the disk surface and the radiating transmitter surface. The particles dislodged from the disk surface by the sonification are carried away by the flowing water and ejected radially with the water by rotating the disk. The ejected water impinges on the sidewalls of a trough and is drained away without splashing. The size difference of the ultrasonic transmitter surface and the disk surface which is to be cleaned is compensated for by the relative motion between the ultrasonic transmitter and the disk, whereby the entire surface area of the disk is successively scanned by the ultrasonic transmitter.

7 Claims, 1 Drawing Sheet

PROCEDURE AND DEVICE FOR CLEANING DISK-SHAPED OBJECTS IN PARTICULAR WAFERS BY SONIFICATION WITH WATER AS RINSING MEDIUM

This invention concerns a procedure and a device for cleaning disk-shaped objects, in particular wafers, by sonification using water as rinsing medium.

Although the invention is here described by taking cleaning of wafers as example, it is pointed out that the procedure is not confined to wafers; also magnetic and optical disk-shaped information media, CD disks and even pharmaceutical products can be treated and cleaned with the procedure of this invention. This invention is also suitable for cleaning disks which are to be coated with a protective layer which must be free from holes.

In the course of semiconductor production, the semiconductor surfaces must be ultra-cleaned before the various processing stages, e.g. before lithographic, resist application or ion implantation processes. When cleaning wafer surfaces it is necessary to overcome, among other effects, the Van der Waals forces which can be of considerable magnitude for particles with diameter smaller than 1 $\mu$m adhering to the surface. When it is intended to remove such particles by sonification, the necessary power levels are so high that with the customary low frequencies used for technical cleaning operations, the crystal lattice of the wafer which is to be cleaned would be destroyed. It is therefore already known that megasonic waves are required for wafer cleaning, i.e. ultrasonic frequencies of the order of 1 MHz. Chiefly two types of such megasonic wafer cleaning systems are known so far:

1) In a tank large enough to permit submersion of entire disks and even entire commercial carriers filled with several disks in an immersion bath in the tank, megasonic waves are coupled-in on the floor or on the side, whereby the immersion bath functions as coupling medium for the ultrasonic waves.

This procedure has several disadvantages. It is readily understandable that in practice good homogeneity of the megasonic power distribution cannot be achieved via the immersion bath. Adequate power density on the disk (wafer) surface can be achieved only with very large and powerful ultrasonic transmitters.

Furthermore, large amounts of liquid are required because with the high demand on cleanliness, the immersion bath contents must be replaced frequently, and in a large immersion bath it is found to be difficult to remove the dislodged particles.

2) The method of conducting the ultrasonic power from the transmitter to the wafer surface with a jet of water is known too. For this purpose a nozzle squirts a jet of water which has been excited by ultrasonic waves onto the wafer surface. The entire surface of the wafer which is to be cleaned can be scanned by rotating the wafer or by tracking the water jet. A disadvantage with this procedure is that the water jet excited with ultrasonic power has a tendency to produce splashing water when impinging on the wafer. Wafer cleaning is carried out in ultra-clean rooms, so that splashing water cannot be tolerated. Splashing water would contaminate neighboring processing stations and droplets carried in the airstream would also make the air filters for the recirculated air damp and thus ineffective.

The chief task of the invention described here is to specify an ultrasonic cleaning procedure for wafers in which the formation of splashing water is avoided, so that it can be carried out in ultra-clean rooms, and with which on the time average good homogeneity of the megasonic power distribution over the wafer is obtained, high ultrasonic power density can be achieved by simple means and continuous removal of the particles dislodged from the wafer surface by sonification is realized.

It is self-evident that good cleaning effect with acceptable input power of the ultrasonic transmitter and uniform energy density on the wafer surface with reasonable costs, are desirable features.

Furthermore, a device will be specified for implementing the procedure according to this invention.

The task is solved by a procedure for cleaning disk-shaped object by sonification using water as rinsing and coupling medium, whose advantages become evident in particular when cleaning wafers, and characterized by the features that the disk-shaped object, i.e. in particular a wafer, is firmly mounted on a carrier, the radiating surface of an ultrasonic transmitter is approached to the disk surface which is to be cleaned, to within a separation in the millimeter range from approx. 0.5 to 5 mm, preferentially 1 to 2 mm, a flowing film of ultra-pure water is produced between the disk surface and the transmitter surface, carrying away and removing the particles dislodged from the disk surface by the sonification, whereby the gap between the radiating surface of the transmitter and the disk surface is so completely filled with water that the water also functions as coupling medium for the ultrasonic waves, that ultrasonic waves are generated at frequencies suitable for cleaning purposes by breaking atomic and/or molecular bonds, and that the size difference between the radiating surface of the ultrasonic transmitter and the surface of the disk which is to be cleaned is compensated by relative motion between the ultrasonic transmitter and the disk such that the disk and/or the transmitter is/are guided in a plane parallel to the disk surface until the entire surface area of the disk which is to be cleaned has been scanned completely at least once.

In the procedure according to this invention, an ultrasonic transmitter with surface radiation is used preferentially. The transmitter surface typically has a diameter of a few centimeters, for example 3 cm. The ultrasonic transmitter is moved at a small separation in the millimeter range from the disk surface over the surface of the disk which is to be cleaned, whereby a separation of 1 to 2 mm is typical. A film of water is formed between the ultrasonic transmitter and the disk surface to transfer the ultrasonic energy to the disk surface. This water film is continually regenerated; this ensures that the dislodged particles are transported away. The water film consists of ultra-clean water which has, for example, been purified previously by passing the water through an ion exchanger column.

It must be pointed out that this invention is not confined to water as rinsing and coupling medium. If the cleaning process requires a different medium, a different liquid can be used provided that this liquid is suitable for coupling the ultrasonic waves.

Furthermore, this invention is not confined to round disks. It is also possible to clean rectangular disks or disk-shaped objects with other boundary forms, provided that they can be mounted such that the ultrasonic transmitter surface is brought opposite to a plane surface.

The relative motion between the disk and the transmitter can be varied arbitrarily to suit the application and the surface form of the disk which is to be cleaned. For example, the ultrasonic transmitter can be guided over the opposite larger disk surface which is to be cleaned, in swivel-strokes for which its mounting is moved on a swivel arm about a rotation axis, or in XY-scanning motion by guiding the transmitter mounting in two linear directions over the surface of the disk. It is important to make sure that every point on the disk surface has received ultrasonic waves in the course of this motion.

Although the disk surface which is to be cleaned can be oriented vertically or obliquely inclined, whereby the water film drains away downwards under gravity, when the application is cleaning of wafers, the disk surface is preferentially oriented horizontally on a turntable and held by vacuum suction. Such vacuum turntables are known from lacquer spin-scattering processes.

In this arrangement the entire wafer surface can be scanned by the ultrasonic transmitter in various ways.

In one form of implementation the ultrasonic transmitter is moved on a swivel arm over the wafer which is rotating on a vacuum table. Thereby the wafer is applied by a water feeder preferentially in front of the ultrasonic transmitter such that it is carried along by the rotating wafer under the ultrasonic transmitter, so that the water fills as completely as possible the space between the ultrasonic transmitter and the surface of the wafer. This gives almost complete power coupling between the ultrasonic transmitter and the surface of the wafer opposite to it.

The water directed by the water feeder onto the wafer surface flows away over the edge of the wafer. A centrifugal effect is produced by the rotation of the wafer whereby the water flowing away is driven radially by the centrifugal force and runs off to the exterior at the edge of the wafer.

The vacuum turntable is preferentially placed in a casing with cylindrical sidewalls which extend above the wafer surface, i.e. the upper edge of the cylindrical sidewalls lies higher than the wafer surface, so that the sidewalls catch the water spinning off the wafer and guide this wafer to the floor of the casing. The water is removed from the ultra-clean room, in which the entire apparatus is located, through a drain on the floor of the casing.

The movement of the ultrasonic transmitter can be implemented with similar effect using linear guidance instead of swiveling with a swivel arm.

Irrespective of whether the ultrasonic transmitter is moved over the working area on the wafer surface by swivel motion or linear guidance, a resting position is provided for the ultrasonic transmitter into which it is brought when placing the wafer onto the rotating table or taking it away therefrom. The resting position is located outside the wafer area.

When the vacuum turntable is arranged, as described above, inside a preferentially cylindrical casing with sidewalls extending above the wafer, the device for swivel or linear guidance is also equipped preferentially with a stroke device with which the ultrasonic transmitter can be raised to above the top edge of the casing and swung or guided out of the region of the wafer into the resting position. This makes it possible to keep the casing in which the vacuum turntable is located relatively small and it can surround the vacuum turntable relatively closely. This prevents any formation of splashing water.

Placing of a wafer onto the vacuum turntable is done while the ultrasonic transmitter is outside the wafer area in its resting position below which preferentially a drop-catcher is placed. After depositing the wafer which is to be processed, the ultrasonic transmitter is moved with the help of the described stroke/turning device from its resting position to a position above the wafer, and then it is lowered to a working distance in the millimeter range of clearance above the wafer surface. For the actual cleaning procedure, the ultrasonic transmitter is then swiveled over its working range through the working angle or moved back and forth over a working distance, while the wafer is rotating under it on the turntable.

After cleaning the wafer surface by sonification, the ultrasonic transmitter is brought back to the resting position. Surplus wafer on the wafer surface can be spun-off by the centrifugal effect of wafer rotation.

An important feature of the invention is the formation of a water film between the surface of the ultrasonic transmitter and the wafer surface for optimum power coupling of the supersonic energy. The water feeder orifice is in the immediate vicinity of the ultrasonic transmitter and directs the water stream onto the wafer surface. The water feeder can be designed in various forms. For example, it can surround the supersonic transmitter as an annular orifice. It has been found particularly effective to design the water feeder as channel-form tube attached at the outer end of the swivel arm beside the ultrasonic transmitter and oriented essentially at right angles to the wafer surface. The rotary motion of the wafer surface drags the escaping water under the ultrasonic transmitter, whereby a certain stowage effect arises underneath the ultrasonic transmitter so that the space between the surface of the transmitter and the wafer surface is filled with wafer completely.

A slightly oblique orientation of the bottom plane surface of the ultrasonic transmitter towards the direction of motion of the wafer further assists in filling of the space between the ultrasonic transmitter and the surface of the wafer with water.

The invention also specifies a device for cleaning waters by sonification and using water as rinsing and coupling medium.

The invention described above has the following advantages:

A very high supersonic power density can be achieved on the wafer surface in a simple manner.

The particles dislodged by the sonification are removed continually.

The cleaning process takes place with practically no production of droplets or splashing water. This is important in local ultra-clean rooms to avoid the danger of moistening the air filters with aerosol droplets, making them ineffective. This avoids contamination of other nearby processing stations to a large extent. This is very important in particular when applying photo-lacquer, because photo-lacquer would be damaged by wafer.

Cleaning of the wafer surface takes place uniformly because the disk surface is scanned by the ultrasonic transmitter with constant energy density (energy per unit area).

The cleaning process according to this invention can be integrated effectively into existing production processes in which the disks rotate, for example the photo-lacquer centrifugal process.

The invention is described below in more detail by consideration of examples of implementation with reference to the attached drawings.

The drawings show:

FIG. 1 A schematic sideview of a device according to this invention, and

Figure 2:
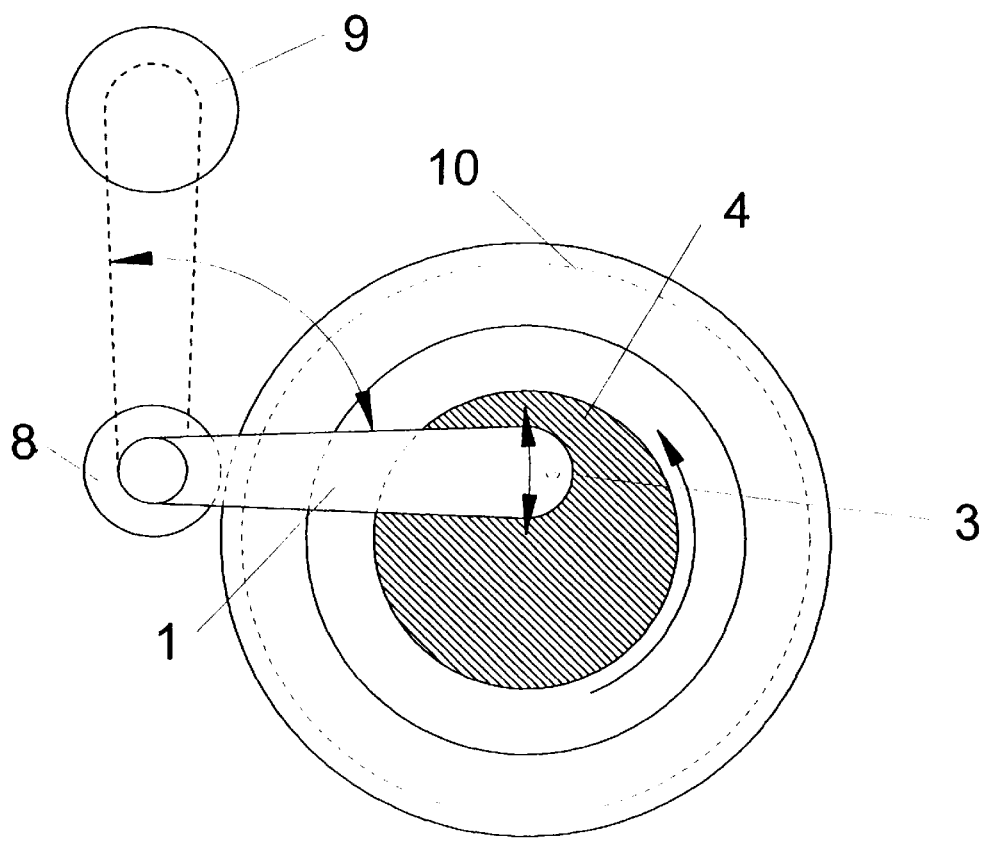

FIG. 2 A schematic top view of the device depicted in FIG. 1.

In the device shown schematically in FIG. 1 the wafers can be cleaned by sonification in ultra-clean rooms, whereby water is used as rinsing and coupling liquid between an ultrasonic transmitter 2 and the surface of a wafer 4 which is to be cleaned. Pure water, produced for example by ion exchange demineralization, flows out through a water feeder 3 in the vicinity of the ultrasonic transmitter 2 in the direction of the surface of the wafer 4 and forms a water film between the ultrasonic transmitter and the wafer. The water flows away over the edge of the wafer and collects in a trough-like casing 10 from which it is removed through a drain 11 on the floor.

The water 4 is mounted on a turntable on which it is held by vacuum suction. This vacuum turntable 5 is connected via a first vertical shaft 7 to a centrifugal motor 6 which rotates it.

The centrifugal shaft 7 is hollow and contains a vacuum line which is connected via a (not depicted) rotating coupling to an external vacuum pumping system.

FIG. 2 shows a top view of the device in which it is seen that the casing 10 essentially surrounds the wafer 4 concentrically. In the depicted implementation example the casing 10 has a cylindrical sidewall whose top edge 12 is inclined inwards and located higher than the wafer surface, thus presenting an impact surface for the water flowing off or spun off the wafer. This sidewall of the casing 10 catches practically the entire consumed rinsing water, so that, also on account of the inward-inclined top edge 12, no water can escape into the space surrounding the device.

The ultrasonic transmitter 2 is attached to the end of a swivel arm 1 which is connected via a second vertical shaft to a stroke and rotation device 8 and can be swiveled about this second vertical axis. FIG. 2 shows how the swivel arm 1 is swung from its resting position above a drop catcher 9 outside the casing 10 to the working position above the wafer 4. In the working region the swivel arm 1 carries out a reciprocating motion over a length corresponding approximately to the radius of the wafer 4. While the swivel arm 1 is moving to and from in this manner, the wafer 4 is rotating beneath it. Thus ultrasonic waves from the ultrasonic transmitter 2 successively reach all positions on the wafer surface.

The ultrasonic transmitter has a radiating surface with a diameter of about 3 cm. Because the energy of the ultrasonic waves can be exploited almost without power loss, by virtue of the good coupling through the water film, a total output power of 2 Watts, i.e. a surface power density of about 0.3 Watt per square centimeter at a frequency of 1 MHz can be sufficient to dislodge contaminating particles on the wafer surface.

In order to produce a film of water which completely fills the space between the ultrasonic transmitter and the wafer surface, the surface of the ultrasonic transmitter is approached to within 1–2 mm of the wafer surface. The swivel arm 1 can be lowered with corresponding control precision by the stroke and turning device 8.

The rotation speed of the vacuum turntable, the reciprocating swiveling motion of the swivel arm 1 over the working area of the wafer surface, the stroke motion of the stroke and turning device 8, the ultra-clean water supply through the water feeder 3 and the radiation duration and intensity of the ultrasonic waves, are coordinated and controlled by a control system (not depicted). The control parameters can differ from one application to another.

It has been found that the cleaning effect for the wafer surface is so efficient that the desired degree of cleanliness can already be reached when the ultrasonic transmitter 2 has completely scanned the surface of the wafer 4 two times or a few times. Thereafter the swivel arm 1 is raised by the stroke and turning device 8 and swung back over the top edge of the casing 10 to its resting position above the drop catcher 9. Remaining water on the wafer surface is spun-off by rapid rotation at speeds up to 100 revolutions per second.

Thereafter the wafer 4 can be lifted off the vacuum turntable 5 and sent to a further processing stage. The swivel motion of the ultrasonic transmitter 2 at the end of the swivel arm 1 depicted by arrows in FIG. 2 can be replace by a (not depicted) linear reciprocating motion in another implementation form. In this case the stroke and turning device 8 is replaced by a stroke and transverse displacement device.

In another alternative implementation form (not depicted), instead of the swivel arm 1, a holding arm is used on the end of which the ultrasonic transmitter and a water feeder are attached in a manner similar to the implementation example shown in FIGS. 1 and 2. This holding arm is moved linearly in two directions, x and y, so that in this manner too it can scan a certain area of the disk-shaped object which is to be cleaned. This arrangement is suitable in particular when not round, but rectangular disks have to be cleaned. Thereby the disk can also be held vertical or obliquely and it can remain stationary. The holding arm for the ultrasonic transmitter must then be moved linearly in two directions in a plane parallel and close to the surface of the disk which is to be cleaned. In this case the water feeder is attached above the ultrasonic transmitter on the holding arm so that the water film is produced by the water flowing downwards. In order to fill the space between the ultrasonic transmitter and the disk surface as completely as possible with water, water feed projections can be formed adjacent to the ultrasonic transmitter. Furthermore, oblique orientation of the ultrasonic transmitter with respect to the disk surface assists stowage of the water stream coming out above the ultrasonic transmitter. Consumed water flows down and away on the vertical or inclined disk surface. Splashing water can be avoided in this case too by placing the device in a trough-form casing with impact sidewalls.

In the preferred implementation form of the cleaning device according to this invention shown in FIGS. 1 and 2 for wafers, the ultrasonic transmitter 2 is slightly inclined relative to the surface of the wafer 4 such that rotation of the wafer 4 stows the water coming out of the water feeder 3 into the space between the ultrasonic transmitter 2 and the surface of the wafer, thus assisting complete filling of this space with wafer.

It must be pointed out that the described device according to this invention is not restricted to particular wafer diameters. The principle of this invention can be applied to any arbitrary realistic wafer size by adapting the dimensions of the vacuum turntable 5 of the casing 10 and of the swivel arm 1 accordingly to suit other dimensions of the wafer to scale.

We claim:

1. Method for cleaning a surface of a disk-shaped object, by sonification and with water as rinsing medium, comprising the steps of:

holding a disk firmly on a supporting device and rotating said disk;

approaching the disk surface that is to be cleaned with an ultrasonic transmitter, a radiating surface of the transmitter having a separation gap from the disk surface in a millimeter range;

producing a flowing film of ultra-clean water between the disk surface and the transmitter radiating surface to carry away and remove particles dislodged from the disk surface, said flowing film being applied beside and in front of said transmitter in a direction of disk rotation and filling the gap between the transmitter surface and the disk surface to be an efficient medium for propagating ultrasonic waves;

generating said ultrasonic waves by said transmitter with frequencies for cleaning purposes to break atomic and/or molecular bonds;

compensating a size difference between the radiating surface of the ultrasonic transmitter and the disk surface that is to be cleaned, by providing relative motion between the ultrasonic transmitter and the disk, one of the disk and the transmitter being moved in a plane parallel to the disk surface to scan the entire disk surface that is to be cleaned by the transmitter at least once.

2. A method as in claim 1, wherein the disk-shaped object is a wafer, and further comprising the steps of holding the wafer horizontally on a turntable by vacuum suction, mounting the ultrasonic transmitter on a moving swivel arm with a water feeder attached to and moving with the ultrasonic transmitter directing a stream of ultra-clean water directly onto the wafer surface, the water flowing away over an outer edge of the wafer.

3. A method as in claim 2, further comprising the step of coordinating rotating speed of the turntable, frequency of reciprocating swivel motion of the swivel arm with the ultrasonic transmitter, the radiating surface of the ultrasonic transmitter, the surface of the wafer that is to be cleaned, and a length of the swivel arm to apply megasonic power evenly on time average over the wafer surface.

4. A method as in claim 2, wherein a rotation direction of the turntable drags the water stream issuing from the water feeder into a region over which the transmitter is located, which region is currently being sonified.

5. A method as in claim 2, wherein a rotation speed of the turntable produces a centrifugal spin-off effect for the water, the wafer being spun-off radially outwards over the outer edge of the wafer.

6. A method as in claim 1, wherein said separation gap is in a range of approximately 1 mm to 2 mm.

7. Method for cleaning a surface of a disk-shaped object, by sonification and with water as rinsing medium, comprising the steps of:

holding a disk firmly on a supporting device and rotating said disk;

approaching the disk surface that is to be cleaned with an ultrasonic transmitter, a radiating surface of the transmitter having a separation gap from the disk surface in a millimeter range;

producing a flowing film of ultra-clean water between the disk surface and the transmitter radiating surface to carry away and remove particles dislodged from the disk surface, said flowing film filling the gap between the transmitter surface and the disk surface to be an efficient medium for propagating ultrasonic waves;

generating said ultrasonic waves by said transmitter with frequencies suitable for cleaning purposes to break atomic and/or molecular bonds;

compensating a size difference between the radiating surface of the ultrasonic transmitter and the disk surface that is to be cleaned, by providing relative motion between the ultrasonic transmitter and the disk, one of the disk and the transmitter being moved in a plane parallel to the disk surface to scan the entire disk surface that is to be cleaned by the transmitter at least once, wherein the radiating surface of the ultrasonic transmitter is inclined slightly against the wafer surface, the separation gap with respect to the wafer surface being slightly greater on the water feed side than on the other side, to produce stowage of the water stream issuing from the water feeder in front of the transmitter surface, good coupling and propagation of the ultrasonic waves being produced.

* * * * *